(12) United States Patent
Cyman, Jr. et al.

(10) Patent No.: US 9,996,788 B2
(45) Date of Patent: Jun. 12, 2018

(54) METHOD AND APPARATUS FOR PRODUCING AN ELECTRONIC DEVICE

(71) Applicant: R.R. DONNELLEY & SONS COMPANY, Chicago, IL (US)

(72) Inventors: Theodore F. Cyman, Jr., Grand Island, NY (US); Alan R. Murzynowski, Grand Island, NY (US); Daniel E. Kanfoush, Grand Island, NY (US)

(73) Assignee: R.R. Donnelley & Sons Company, Chicago, IL (US)

( * ) Notice: Subject to any disclaimer, the term of this patent is extended or adjusted under 35 U.S.C. 154(b) by 230 days.

(21) Appl. No.: 14/825,986

(22) Filed: Aug. 13, 2015

(65) Prior Publication Data
US 2016/0050762 A1   Feb. 18, 2016

Related U.S. Application Data

(60) Provisional application No. 62/036,898, filed on Aug. 13, 2014, provisional application No. 62/036,953, filed on Aug. 13, 2014.

(51) Int. Cl.
*G06K 19/077* (2006.01)
*H05K 3/04* (2006.01)
(Continued)

(52) U.S. Cl.
CPC ........... *G06K 19/077* (2013.01); *H05K 3/046* (2013.01); *H05K 1/115* (2013.01); *H05K 3/4685* (2013.01);
(Continued)

(58) Field of Classification Search
CPC ............. G06K 19/077; H05K 1/115; H05K 2201/10098; H05K 2203/0522; H05K 2203/1545; H05K 3/046; H05K 3/4685
(Continued)

(56) References Cited

U.S. PATENT DOCUMENTS 4,012,552 A   3/1977 Watts
5,520,763 A   5/1996 Johnstone
(Continued)

FOREIGN PATENT DOCUMENTS

FR   2 997 218 A1   4/2014
JP   2003-277653   10/2003
(Continued)

OTHER PUBLICATIONS

Non-Final Office Action dated Dec. 2, 2016, for U.S. Appl. No. 15/043,885, Applicant, R.R. Donnelley & Sons Company (8 pages).
(Continued)

*Primary Examiner* — Sonya Mazumdar
(74) *Attorney, Agent, or Firm* — McCracken & Gillen LLC

(57) ABSTRACT

A method and apparatus for producing an electronic device are disclosed. An adhesive material is jetted in a first pattern on a surface of a receiver substrate. A carrier having a metal foil disposed thereon is brought into contact with the first substrate such that a portion of the metal foil contacts the adhesive material. The adhesive material is activated using at least one of mechanical pressure and heat while the portion of the metal foil is in contact with the adhesive material. The first substrate and the second substrate are separated, whereby the portion of the metal foil is transferred to the first substrate.

12 Claims, 11 Drawing Sheets

(51) Int. Cl.
*H05K 1/11* (2006.01)
*H05K 3/46* (2006.01)

(52) U.S. Cl.
CPC ............ *H05K 2201/10098* (2013.01); *H05K 2203/0522* (2013.01); *H05K 2203/1545* (2013.01)

(58) Field of Classification Search
USPC ................................. 156/233, 578
See application file for complete search history.

(56) References Cited

U.S. PATENT DOCUMENTS

| | | | |
|---|---|---|---|
| 5,581,065 A * | 12/1996 | Nishikawa | G06K 19/072 235/487 |
| 5,802,015 A | 9/1998 | Rothschild et al. | |
| 6,019,865 A | 2/2000 | Palmer et al. | |
| 6,013,745 A | 3/2000 | Lake | |
| 6,043,745 A | 3/2000 | Lake | |
| 6,223,799 B1 | 5/2001 | Johnstone | |
| 6,420,096 B1 | 7/2002 | Löbl et al. | |
| 6,421,013 B1 | 7/2002 | Chung | |
| 6,544,864 B2 | 4/2003 | Reeder et al. | |
| 6,853,087 B2 | 2/2005 | Neuhaus et al. | |
| 6,886,745 B2 | 5/2005 | Berrube et al. | |
| 6,888,509 B2 | 5/2005 | Atherton | |
| 6,924,781 B1 | 8/2005 | Gelbman | |
| 7,042,357 B2 | 5/2006 | Girvin et al. | |
| 7,057,495 B2 | 6/2006 | Debord et al. | |
| 7,168,626 B2 | 1/2007 | Lerch et al. | |
| 7,174,277 B2 | 2/2007 | Vock et al. | |
| 7,204,425 B2 | 4/2007 | Mosher, Jr. et al. | |
| 7,283,054 B2 | 10/2007 | Girvin et al. | |
| 7,295,115 B2 | 11/2007 | Aljadeff et al. | |
| 7,316,358 B2 | 1/2008 | Kotik et al. | |
| 7,323,360 B2 | 1/2008 | Gonzalez et al. | |
| 7,377,447 B2 | 5/2008 | Oberle | |
| 7,417,541 B2 | 8/2008 | Lerch et al. | |
| 7,586,412 B2 | 9/2009 | Takatama | |
| 7,627,451 B2 | 12/2009 | Vock et al. | |
| 7,639,135 B2 | 12/2009 | Arms et al. | |
| 7,737,839 B1 | 6/2010 | Jones | |
| 7,802,222 B2 | 9/2010 | Arsintescu | |
| 7,856,339 B2 | 12/2010 | Vock et al. | |
| 7,895,739 B2 | 3/2011 | Niklas et al. | |
| 7,945,320 B2 | 5/2011 | Durand | |
| 7,993,055 B2 | 8/2011 | Nurse et al. | |
| 8,126,675 B2 | 2/2012 | Vock et al. | |
| 8,203,446 B2 | 6/2012 | Tsubota et al. | |
| 8,219,466 B2 | 7/2012 | Gui | |
| 8,280,682 B2 | 10/2012 | Vock et al. | |
| 8,317,084 B2 | 11/2012 | Bagai | |
| 8,354,927 B2 | 1/2013 | Breed | |
| 8,428,904 B2 | 4/2013 | Vock et al. | |
| 8,590,799 B2 | 11/2013 | Liu | |
| 8,618,914 B2 | 12/2013 | Bachman et al. | |
| 8,640,259 B2 | 1/2014 | Jung et al. | |
| 8,762,212 B2 | 6/2014 | Falls et al. | |
| 8,870,083 B2 | 10/2014 | Myers et al. | |
| 9,030,724 B2 | 5/2015 | Agrawal et al. | |
| 9,047,437 B2 | 6/2015 | Chen et al. | |
| 9,077,183 B2 | 7/2015 | Thomas et al. | |
| 9,087,318 B1 | 7/2015 | Cordes et al. | |
| 9,495,498 B2 | 11/2016 | Bartley et al. | |
| 2004/0066296 A1 | 4/2004 | Atherton | |
| 2011/0131854 A1 | 6/2011 | Waltersdorf | |
| 2012/0162945 A1 | 6/2012 | Schreiner | |
| 2016/0055453 A1 | 2/2016 | Cyman, Jr. et al. | |
| 2016/0148899 A1 | 5/2016 | Ichimura | |

FOREIGN PATENT DOCUMENTS

| | | |
|---|---|---|
| JP | 2011 151259 | 8/2011 |
| WO | WO-00-73082 | 12/2000 |
| WO | WO-03-06736 | 1/2003 |
| WO | WO-14-67578 | 5/2014 |
| WO | WO 2015/004830 A1 | 1/2015 |

OTHER PUBLICATIONS

International Search Report and Written Opinion dated Apr. 6, 2017, for International Application No. PCT/US2017/013464, Applicant, R.R. Donnelley & Sons Company (14 pages).
Duck, A., Dispensing SMD Adhesives: Rotary Pump Technology vs. Stencil Printing Technology, Electronic Packaging and Production, Aug. 1, 1996, pp. 41-44, vol. 36, No. 9, Cahners Publishing Co, Newton Massachusetts, U.S. (4 pages).
International Search Report and Written Opinion dated Oct. 8, 2015, for International Application No. PCT/US2015/045089, Applicant, R.R. Donnelley & Sons Company (10 pages).
International Search Report and Written Opinion dated Oct. 20, 2015, for International Application No. PCT/US2015/045128, Applicant, R.R. Donnelley & Sons Company (10 pages).
U.S. Appl. No. 15/344,939, R.R. Donnelley & Sons Company.
U.S. Appl. No. 14/996,413, R.R. Donnelley & Sons Company.
U.S. Appl. No. 15/043,885, R.R. Donnelley & Sons Company.
U.S. Appl. No. 14/853,563, R.R. Donnelley & Sons Company.
International Search Report and Written Opinion dated Nov. 25, 2015, for International Application No. PCT/US2015/045922, Applicant R.R. Donnelley & Sons Company (11 pages).
Non-final Office action dated Oct. 12, 2016, for U.S. Appl. No. 14/853,563, Applicant, R.R. Donnelley & Sons Company (9 pages).

* cited by examiner

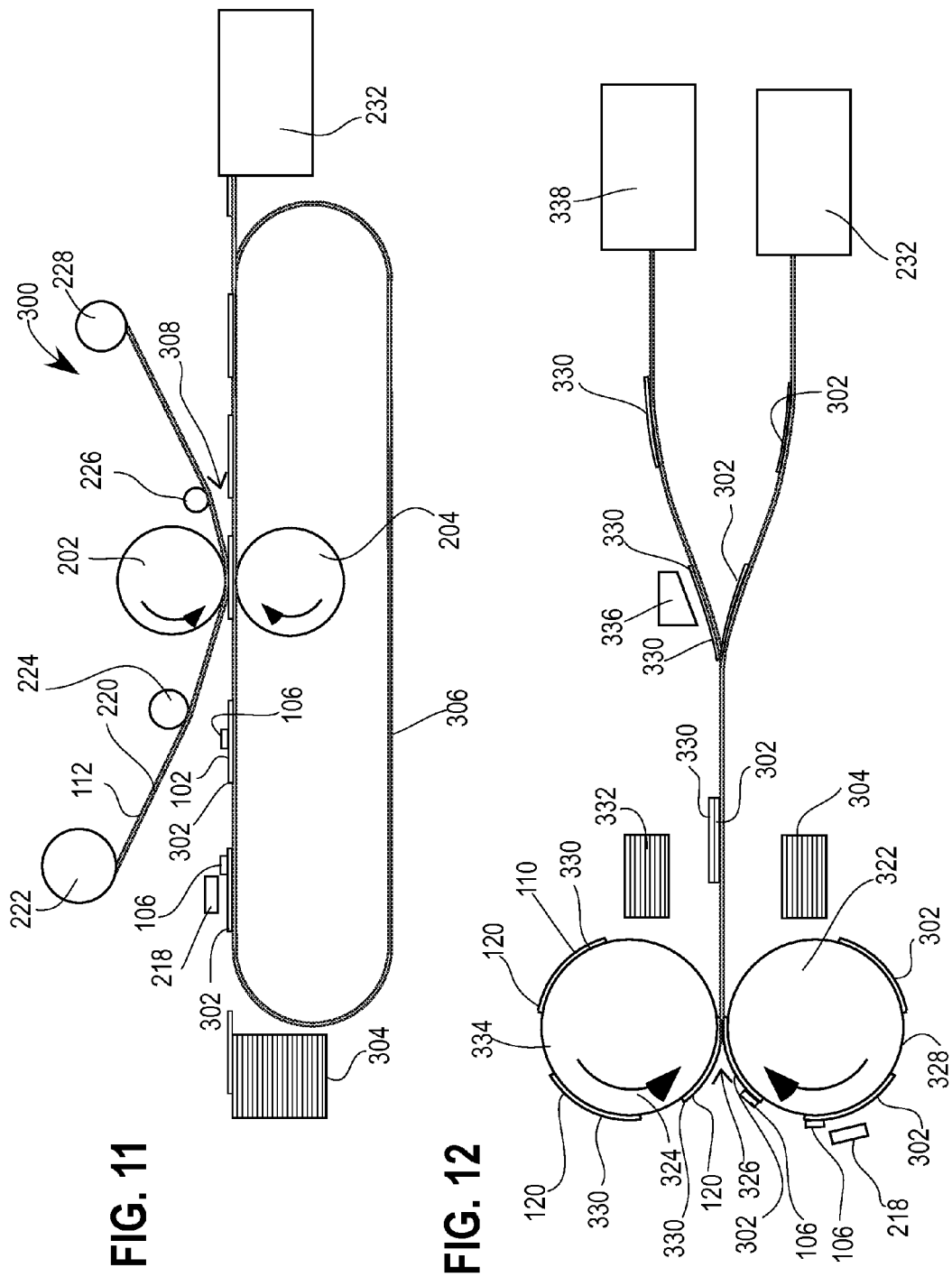

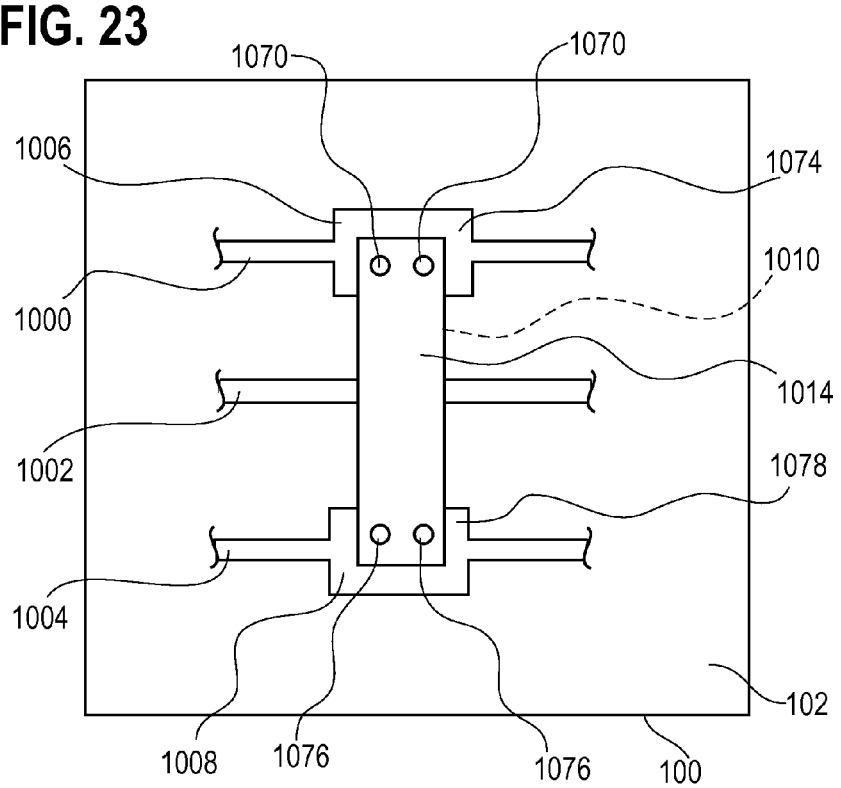
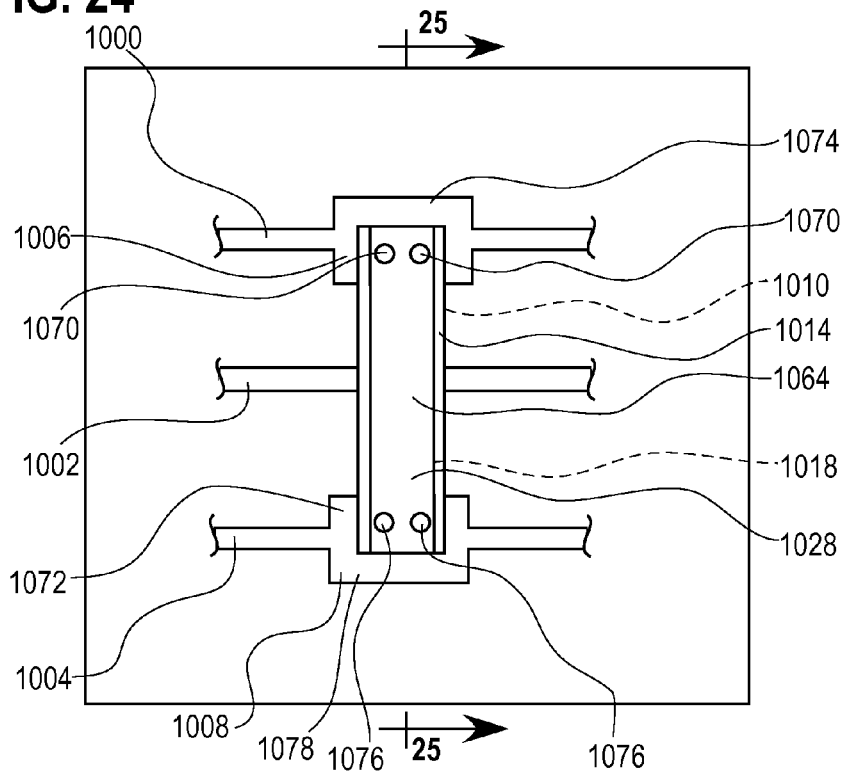

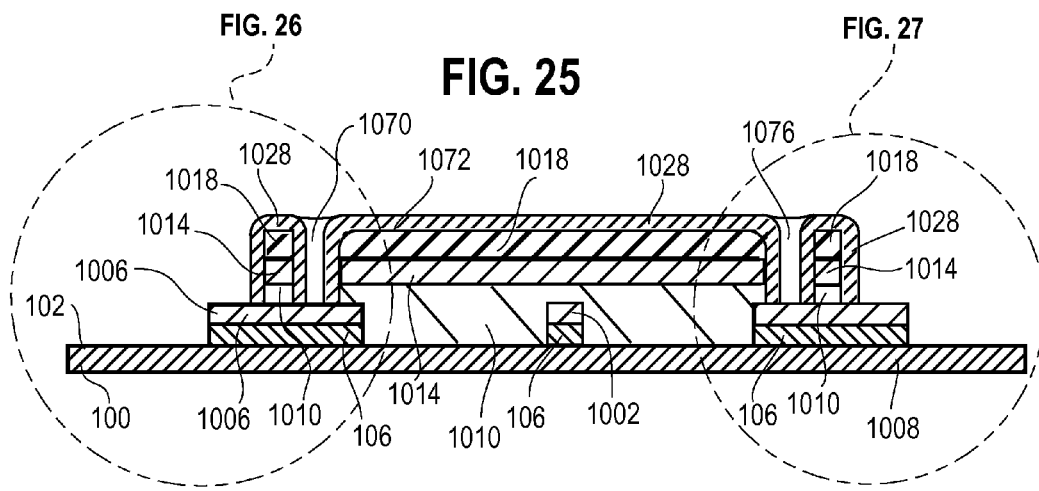
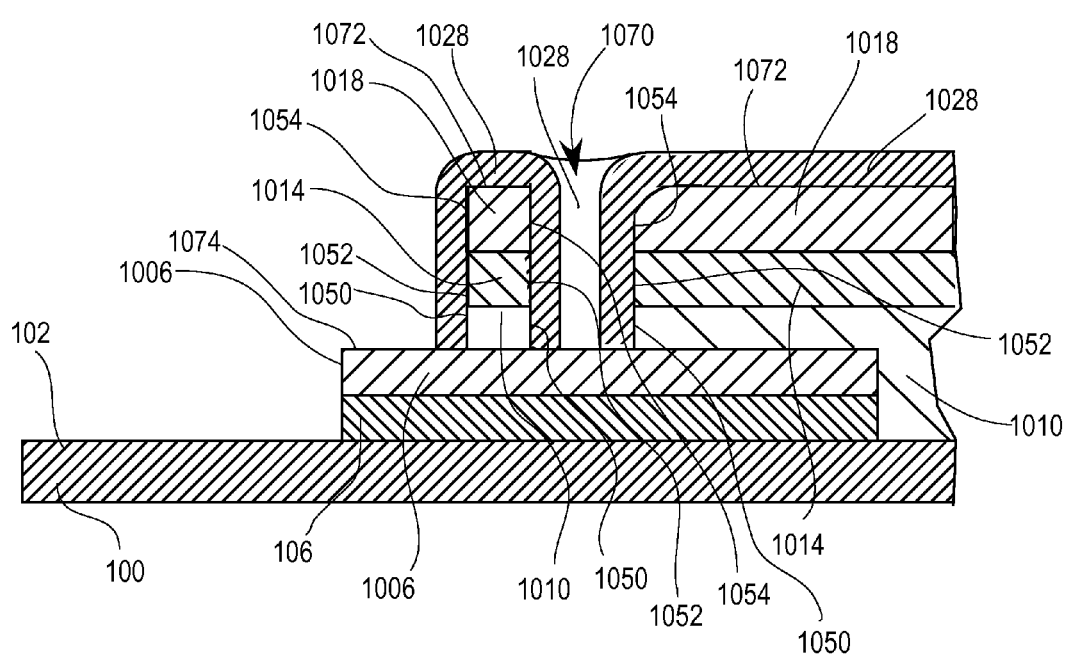

METHOD AND APPARATUS FOR PRODUCING AN ELECTRONIC DEVICE

CROSS REFERENCE TO RELATED APPLICATIONS

The present application claims benefit of U.S. Provisional Patent Application No. 62/036,953, filed Aug. 13, 2014, having the title "ADHESIVE COMPOSITION FOR INKJET PRINTING;" and U.S. Provisional Patent Application No. 62/036,898, filed Aug. 13, 2014, having the title "METHOD AND APPARATUS FOR ADHESIVE TRANSFER OF MATERIALS." The entire contents of these applications are incorporated herein by reference.

FIELD OF DISCLOSURE

The present subject matter relates to producing electronic devices by printing metals and other conductive materials, and more particularly, to using foil transfer printing.

BACKGROUND

Metals may be applied to products for both decorative and functional reasons. A metal may be applied to portions of a product, such as a container, a certificate, or a publication to distinguish such portions from other portions that are free of the metal or are printed with non-metallic ink. Metals may also be applied to a substrate to form electrically conductive areas on the substrate such as, for example, traces of an electronic circuit or an imprinted antenna, for example, an antenna for use with a radio-frequency identification transponder.

An image in metal may be formed on a substrate by printing such image with a metallic ink using, for example, gravure, lithographic, and inkjet printing systems. In such printing systems, liquid metallic ink may be applied to the substrate in a manner similar to how non-metallic ink may be applied thereto.

Alternately, a metal image may be formed on the substrate, by coating the substrate indiscriminately with a metal or applying a metal foil to the substrate. Thereafter, portions of the metal or metal foil that are not part of the image may be selectively removed from the substrate by, for example, etching or ablation.

U.S. Pat. No. 5,520,763 discloses transferring foil to a substrate by first selectively applying to the substrate toner particles that have a thermoplastic component. The foil is supplied on a foil strip that includes an adhesive layer facing outwardly, a foil layer, and a release coating on a backing. The foil strip with the adhesive layer and the substrate are introduced into a nip between an impression cylinder and a transfer cylinder. Heat and pressure are applied at the nip to transfer the adhesive and foil from the foil strip to the toner on the substrate to produce a foil printed substrate. The toner on the substrate may be heated before the substrate enters the nip to increase the tackiness thereof.

SUMMARY

According to one aspect, a method of producing an electronic device includes the steps of applying an adhesive material in a first pattern on a surface of a receiver substrate and bringing a second substrate having a metal foil disposed thereon proximate to the first substrate such that a portion of the metal foil contacts the adhesive material. The method includes the further steps of activating the adhesive material and separating the first substrate and the second substrate, whereby the portion of the metal foil is transferred to the first substrate. In addition, the method includes the steps of applying a further adhesive material in a second pattern on top of the transferred metal foil, and depositing a metallic material on top of the second pattern. The matallic material is conductively coupled to a portion of the transferred metal foil.

According to another aspect, a method for producing an electronic device includes the steps of jetting an adhesive material in a first pattern on a surface of a first substrate and bringing a second substrate having a metal foil disposed thereon proximate to the first substrate such that a portion of the metal foil contacts the adhesive material. The method also includes the steps of activating the adhesive material and separating the first substrate and the second substrate, whereby the portion of the metal foil is transferred to the first substrate. Further, the method includes the steps of applying a further adhesive material in a second pattern on top of the transferred metal foil, depositing a metallic material on top of the second pattern, and forming a via from a top surface of the further adhesive material to the transferred metal foil. The metallic material is conductively coupled to a portion of the transferred metal foil.

BRIEF DESCRIPTION OF THE DRAWINGS

FIG. 11 is a schematic view of yet another embodiment of a system that may be used to transfer metal from a carrier substrate to a receiver substrate;

FIG. 12 is a schematic view of still yet another embodiment of a system that may be used to transfer metal from a carrier substrate to a receiver substrate.

FIG. 23 is a plan view of the receiver substrate of FIG. 13 having a first pattern of adhesive material deposited thereon and an insulating material transferred thereto;

FIG. 24 is a plan view of the receiver substrate of FIG. 23 having a second pattern of adhesive material deposited thereon and a conductive material transferred thereto;

FIG. 25 is a cross-sectional view take along the line 25-25 of the receiver substrate of FIG. 24;

FIG. 26 is a magnified view of a portion taken from the region identified by line 26-26 of the receiver substrate of FIG. 25;

DETAILED DESCRIPTION

Figure 1:
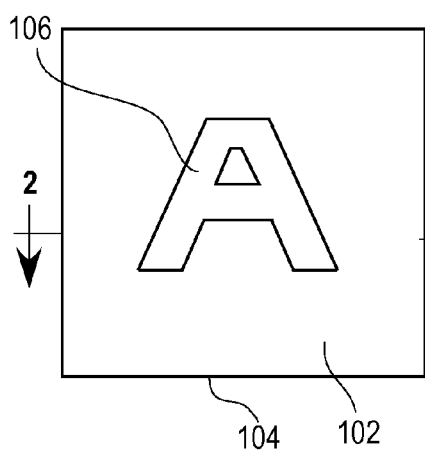
FIG. 1 is a plan view of a receiver substrate.
Figure 2:
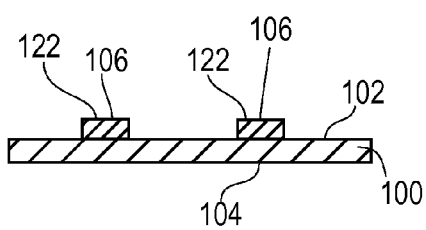
FIG. 2 is a cross-sectional view taken along the line 2-2 of the receiver substrate of FIG. 1.

Referring to FIGS. 1 and 2, a receiver substrate 100 has a first surface 102 and a second surface 104. An adhesive material 106 is deposited on the first surface 102 in a pattern associated with an image. In some embodiments, the adhesive material 106 is allowed to dry and become inactive. In some cases, the adhesive material 106 thereafter may be activated by application of energy (such as heat, visible light, invisible light, or another form of energy) and/or pressure. The receiver substrate may be coated or uncoated paper, plastic, polyethylene, a metal, or any substrate on which the adhesive material 106 may be deposited.

In some embodiments, one or more portions of the first surface 102 are receptive to the adhesive material 106 and other portions may not be receptive to such adhesive material 106. In such embodiments, the adhesive material 106 is applied in a pattern in the portion of the first surface 102 that is receptive to adhesive material to form image and non-image areas in such portion.

In some embodiments, the adhesive material 106 may be selectively deposited in a pattern onto the first surface 102 by a jetting device. The jetting device may be, for example, an inkjet head such as a Kyocera KJ4B Printhead, manufactured by the Kyocera Corporation, Kyoto, Japan, a Fuji Samba series or Dimatix series inkjet head manufactured by Fujifilm Dimatix, Inc., of Santa Clara, Calif. U.S. Provisional Patent Application No. 61/903,829, filed Nov. 13, 2013, discloses an adhesive material 106 that may be deposited by a jetting device. The entire contents of this application are incorporated herein by reference.

Figure 3:
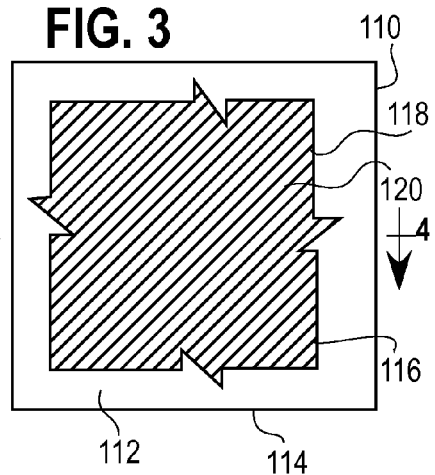
FIG. 3 is a plan view a carrier substrate.
Figure 4:
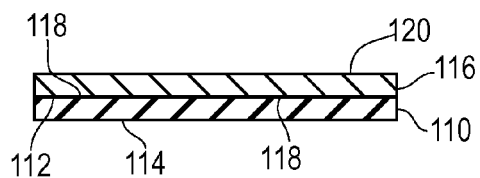
FIG. 4 is a cross-sectional view taken along the line 4-4 of the carrier substrate of FIG. 3.

Referring to FIGS. 3 and 4, a carrier substrate 110 has a first surface 112 and a second surface 114. A metal foil layer 116 is disposed on at least a portion of the first surface 112.

An inner surface 118 of the metal foil layer 116 faces and is adhered to the first surface 112. In some embodiments, the inner surface 118 of the metal foil layer 116 is adhered to the first surface 112 by an adhesive layer (not shown) therebetween. In other embodiments, the metal foil layer 116 adheres to the first surface 112 because of an electrical or chemical attraction, or a chemical bond therebetween. The metal foil layer 116 may comprise aluminum, silver, copper, gold, a metal alloy, other electrically conductive materials, and the like. In some embodiments, the carrier substrate 110 having the metal foil layer 116 disposed thereon may be coated or uncoated paper, plastic, polyethylene, or another substrate receptive to the metal.

Figure 5:
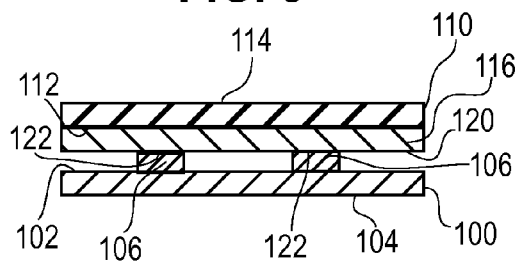
FIG. 5 is a cross-sectional view of the receiver substrate of FIG. 1 and the carrier substrate of FIG. 3 in contact with one another.
Figure 7:
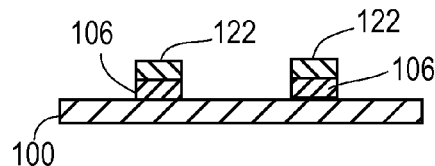
FIG. 7 is a cross-sectional view taken along the line 7-7 of the receiver substrate of FIG. 6.
Figure 6:
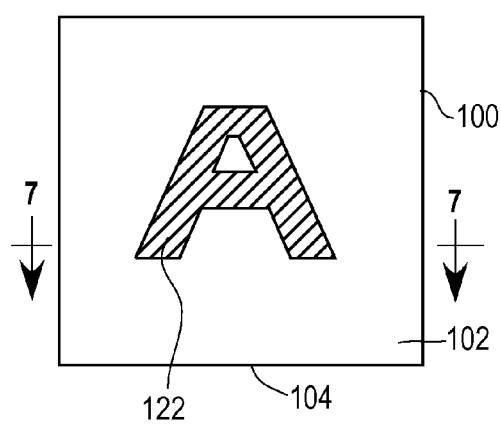
FIG. 6 is a plan view of the receiver substrate of FIG. 1 after a metal foil has been transferred thereto.

Referring to FIGS. 5-7, in order to transfer a selected portion the metal foil layer 116 to the receiver substrate 100 from the carrier substrate 110, the receiver substrate 100 and carrier substrate 110 are brought together so that the first surface 102 of the receiver substrate 100 and the first surface 112 of the carrier substrate 100 face each other, and a top surface 120 of the metal foil layer 116 contacts a top layer 122 of the adhesive material 106. In some embodiments, the adhesive material 106 may be activated by, for example, application of energy thereto before the receiver substrate 100 and the carrier substrate 110 are brought together in this manner. In other embodiments, the adhesive material 106 may be activated by application of energy and/or pressure after the receiver substrate 100 and the carrier substrate 110 are brought together. In still other embodiments, the adhesive material 106 may be activated before the receiver substrate 100 and the carrier substrate 110 are brought together, and then further activated while the adhesive material 106 and the metal foil layer 116 are in contact with one another.

The adhesive material 106, the carrier 110, and the metal foil layer 116 are selected so that when a portion of the metal foil layer 116 contacts the activated adhesive material 106, such portion of the metal foil layer 116 adheres more strongly to the adhesive material 106 than to the first surface 112 of the carrier 110. Thereafter, the substrate 100 and the carrier 110 are pulled away from one another. A portion 122 of the metal foil layer 120 separates from the first surface 112 of the carrier 110, remains atop the pattern of the adhesive material 106, and is thus transferred to the substrate 100. The portion 122 of the metal foil layer 120 that remains atop the pattern of the adhesive material 106 substantially duplicates the pattern of the adhesive material 106. In some embodiments, if the adhesive material 106 is a heat activated adhesive, the activated adhesive material 106 is allowed to cool below an activation temperature after the portion 122 of the metal foil layer 120 is contacted thereto, and before the substrate 100 and the carrier are separated from one another. Allowing the adhesive material 106 to cool in this manner may improve the bond between the portion 122 of the metal foil layer 120 and the pattern of the adhesive material 106.

Figure 8:
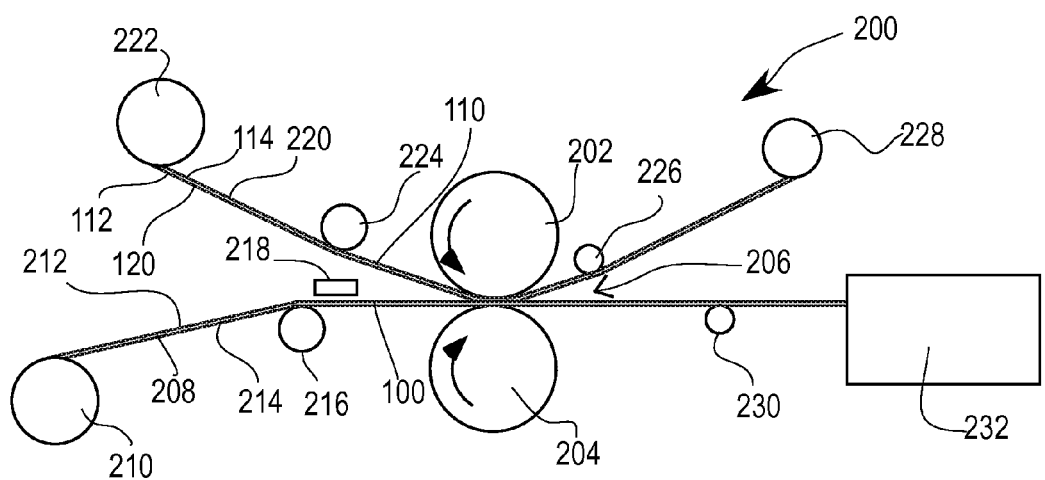
FIG. 8 is a schematic view of an embodiment of a system to transfer metal from a carrier substrate to a receiver substrate.

Referring to FIG. 8, an embodiment of a system 200 for transferring the metal foil to the receiver substrate 100 from the carrier substrate 110 includes a first cylinder 202, a second cylinder 204, and a nip 206 therebetween. In some embodiments, the receiver substrate 100 may be supplied as a web 208 from a supply roll 210. The web 208 has a first surface 212 and a second surface 214. One or more guide rollers 216 guide the web past an adhesive applicator 218 and into the nip 206. The adhesive applicator 218 deposits a pattern of the adhesive material 106 onto the web 208 to form the receiver substrate 100.

Concurrently, a web 220 of the carrier substrate 110 is supplied from a supply roll 222 and guided by one or more rollers 224 into the nip 206. As described above, the web 220 of the carrier substrate 110 has a first side 112, onto which a layer of metal foil 120 has been previously disposed, and a second side 114. The webs 208 and 220 are guided into the nip 206 such that the first side 212 of the web 208 faces the first side 112 of the web 220. The first cylinder 202 and the second cylinder 204 apply pressure to the two webs 208 and 220 when such webs 208 and 220 are in the nip 206. Such pressure activates the adhesive material 106 on the first side 212 of the web 208. In some embodiments, one or both of the cylinders 202 and 204 may be heated, and such heat may activate the adhesive material 106 when the web 208 is in the nip 206. Any portion of the metal foil layer 120 that is in contact with the adhesive material 106 on the first side 212 is thus bonded thereto.

The two webs 208 and 220 then exit the nip 206. The web 220 of the carrier substrate 110 is guided by one or more guide rollers 226 to a take up cylinder 228 and wound thereon. After portions of the metal foil layer 120 from the carrier substrate 110 are transferred to the web 208, one or more guide rollers 230 guide such web to a finishing station 232. In some embodiments, the finishing station 232 may simply be take-up reel on which the web 208 is wound. In other embodiments, the finishing station 232 may include one or more of a cutter, folder, stacker, inserter, and the like. In addition, if the metal foil layer 120 is deposited onto the web 208 of the receiver substrate 100 in a pattern associated with one or more conductive traces of an electronic circuit, the finishing station 232 may include apparatus for placing electronic components onto such electronic circuit.

In some embodiments, the adhesive applicator 218 may form the pattern of adhesive material 106 on top of the layer of metal foil 120 disposed on the web 220, instead of forming such pattern on the web 208. The two webs 208 and 220 may be transported through the nip 206 as described above, and the portion of the metal foil 120 that are covered by the pattern of adhesive material 106 is transferred to the web 208.

It will be apparent to those who have skill in the art, that the system 200 may include control systems to synchronize the transport of the webs 208 and 220, the adhesive applicator 218, the cylinders 202 and 204, the guide rollers 216, 224, 226, and 230, the take-up reel 228, and/or the finishing station 232.

Figure 9:
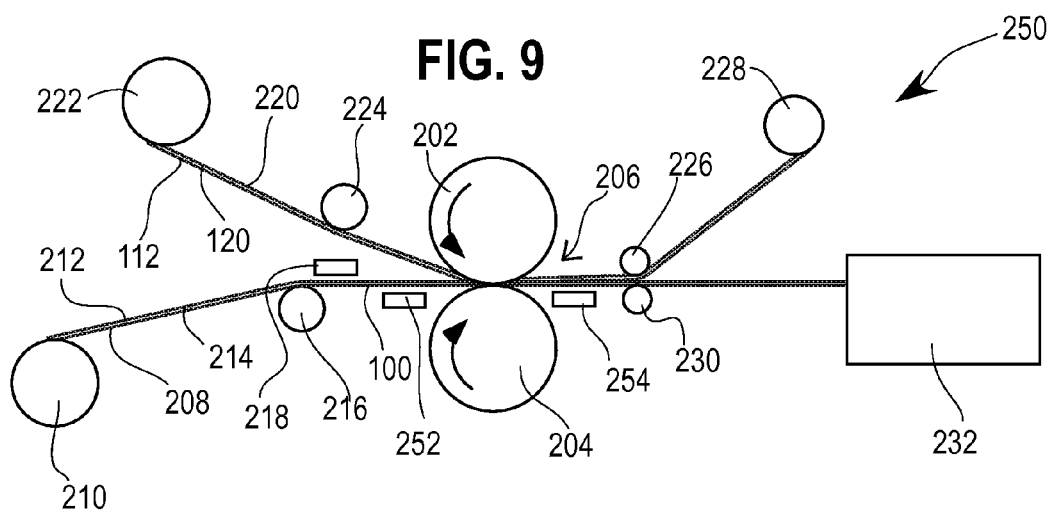
FIG. 9 is a schematic view of another embodiment of a system to transfer metal from a carrier substrate to a receiver substrate.

Referring to FIG. 9, another embodiment of a system 250 is similar to the system 200 described above, except the system 250 may include an adhesive activation unit 252 and/or a bond formation unit 254. The adhesive activation unit 252 is disposed along the path of the web 208 after the adhesive applicator 218 deposits the adhesive material 106 onto the web 208 and before the web 208 enters nip 206. The adhesive activation unit 252 activates the adhesive material 106 before such material contacts the metal foil layer 120 on the web 220. The adhesive activation unit 252 may be a heater, a light emitter, a pressure applicator, an activating agent applicator, and the like. It will be apparent to those who have skill in the art, that the adhesive activation unit 252 may be selected in accordance with the activation properties of adhesive material 106.

The bond formation unit 254 may be a device that facilitates formation and/or strengthening of a bond between the pattern of the adhesive material 106 and the portion of the metal foil layer 120 contacted therewith. In some embodiments, the webs 208 and 220 remain in contact as such webs exit the nip 206 and travel past the bond formation unit 254. In other embodiments, the webs 208 and 220 may be separated after the exit from the nip 206 and before the web 208 reaches the bond formation unit 254.

The bond formation unit 254 may include a chiller, a light emitter, a curing device, and the like. In some embodiments, the bond formation unit 254 applies an agent to the web 208 that facilitates formation and/or strengthening of the bond between the adhesive material 106 and the portion of the metal foil layer 120 deposited thereon.

Figure 10A:
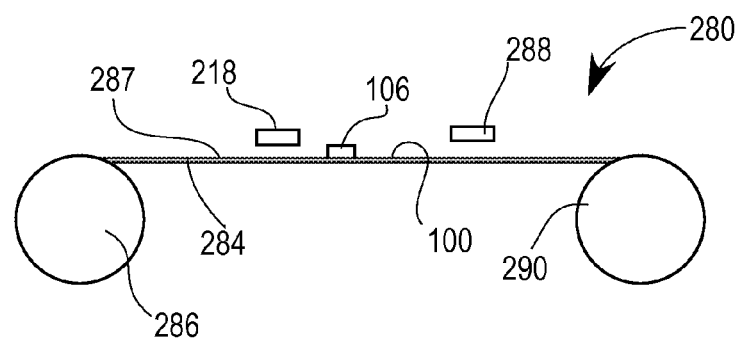
FIG. 10A is a schematic view an embodiment of a system to produce a web of a receiver substrate.
Figure 10B:
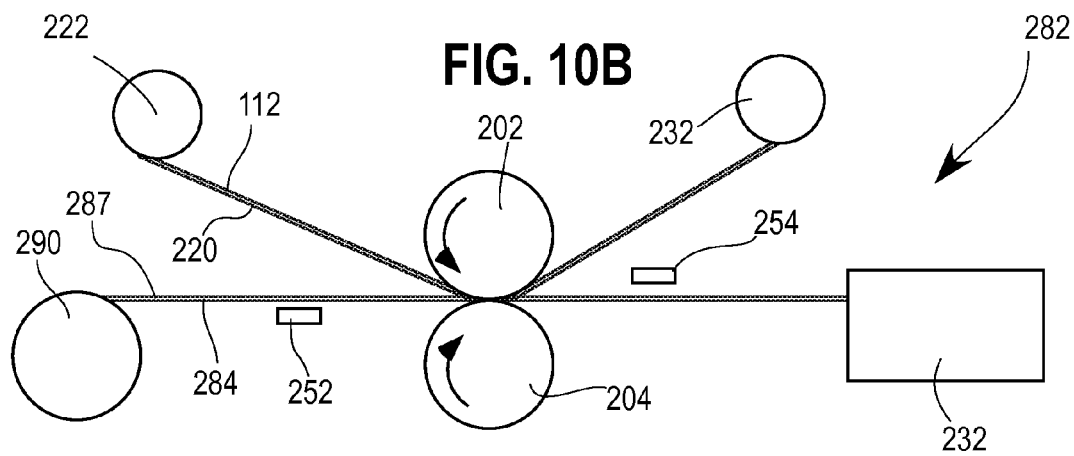
FIG. 10B is a schematic view of a system to transfer metal from a carrier substrate to the receiver substrate produced using the system of FIG. 10A.

Referring to FIGS. 10A and 10B, in some embodiments a web of carrier substrate may be manufactured using a receiver manufacturing system 280 that selectively applies adhesive material 106 to define the image areas of the carrier substrate 100. The metal foil may then be transferred to such image areas using a foil transfer system 282.

For example, referring to FIGS. 10A and 10B, in the receiver manufacturing system 280, a web 284 may be transported from a supply reel 286 and past the adhesive applicator 218, which applies the pattern of the adhesive material 106 to a surface 287 of the web 284. In some embodiments, a dryer 288 may then dry the adhesive material 106. The web 284 with adhesive material 106 thereon may be wound onto a take-up reel 290. The take-up reel 290 may be stored until metal foil is to be transferred thereto.

To transfer the metal foil, the take-up reel 290 may be used in the foil transfer system 282. In particular, the web 284 is unwound from the take-up reel 290 and brought into contact with a web 220 of carrier material in the nip 206, as described above. The adhesive activation unit 252 and/or the bond formation unit 254 may be used as described above in the foil transfer system 282. After the web 284 exits the nip, such web is transported to the finishing system 232.

Control systems, transport systems, and guide rollers are not depicted FIGS. 10A and 10B to simplify such drawings. The use of these systems and rollers in the systems depicted in FIGS. 10A and 10B will be apparent to those who have skill in the art.

Although the embodiments of systems depicted in FIGS. 8-10 illustrate the receiver substrate 100 and carrier substrate 102 supplied as webs 208 and 220, one or both of these substrates may be supplied as sheets. For example, referring to FIG. 11, in an embodiment of a system 300, sheets 302 of the receiver substrate 100 are supplied from a stack 304 of such sheets and placed on a conveyor 306. The conveyor transports the sheet 302 past the adhesive applicator unit 218, which applies the pattern of the adhesive material 106 onto the sheet 302. The sheet 302 continues into a nip 308 formed between the cylinders 202 and 204. In some embodiments, the cylinder 204 may not be necessary, and the nip 308 is formed between the cylinder 202 and the conveyor 306.

Concurrently, one or more guide rollers 224 transport the web 220 of the carrier substrate 112 into the nip 308. The cylinders 202 and 204 apply energy and/or pressure to facilitate adhesion of portions of the metal foil layer 120 to the pattern of adhesive 106 formed by the adhesive applicator unit.

Thereafter, the sheet 302 with portions of the metal layer 120 transferred thereto is transported from the nip 308 by the conveyor to the finishing unit 232. The web 220 is transported from the nip 308 to the take-up reel 228. In some embodiments, one or more guide rollers 226 transport the web 220 to the take up reel 228.

Referring to FIG. 12, in some embodiments, a system 320 includes cylinders 322 and 324 that are disposed to form a nip 326 therebetween. The sheets 302 of the receiver substrate 100 are supplied from the stack 304 of such sheets, and secured to an outer surface 328 of the cylinder 322. Concurrently, sheets 330 of the carrier substrate 110 are supplied from a stack 332 and secured to an outer surface 334 of the cylinder 324. The sheets 302 and 330 may be secured to the surfaces 328 and 334, respectively, using one or more of a vacuum source, electrostatic charge, a clamp, and other ways apparent to those who have skill in the art.

Rotation of the cylinder 322 transports each sheet 302 on the surface 328 thereof past the adhesive application unit 218 and into the nip 326. The adhesive application unit 218 applies the pattern of adhesive material 106 onto the sheet 302 as described above. In some embodiments, an application unit 218 applies the pattern of adhesive material 106 onto the sheet 330 in addition to or instead of the sheet 302. Rotation of the cylinder 324 transports each sheet 330 on the surface 334 thereof into the nip 326. The operation of the cylinders 322 and 324 are synchronized so that the sheet 302 and the sheet 330 enter the nip 326 concurrently. Portions of the metal foil layer 120 from the sheet 330 are transferred on top of the pattern of adhesive material 106 on the sheet 302 as described above.

The sheets 302 and 330 may emerge from the nip 326 with one sheet stacked atop the other. A sheet separator unit 336 separates the sheet 302 from the sheet 330. The sheet 302 with metal transferred thereto may be transported to the finishing unit 232. The sheet 330 may be transported to a carrier material collector 338 that collects and stores the carrier substrate 112 from which portions of the metal foil layer 120 have been removed. Such collected carrier substrate 112 may be recycled, reused, and/or disposed.

The printing process described in the foregoing may be used to transfer materials other than a metal foil from carrier substrate 110 to a receiver substrate 100. For example, metals and other conductors, semi-conductors, and insulators may be applied in such manner to form a electronic product having one or more conductive, semi-conductive, and insulating layers on the receiver substrate 100. For example, instead of a metal foil layer 120, a layer of a non-metal material may be disposed on at least a portion of the first surface 112 of the carrier substrate 110. Thereafter, as described above, portions of the layer of a non-metal material may be transferred from the carrier substrate 110 to the portions of a receiver substrate where the pattern of adhesive material 106 has been deposited.

If the non-metal material is also an insulator, patterns of a metal material (or other conductive material) and such non-metal material may be deposited one after another on the receiver surface to form a multi-layer circuit thereon. Examples of insulating materials include an acrylic, polytetrafluoroethylene, polyester, polypropylene, and the like.

Figure 13:
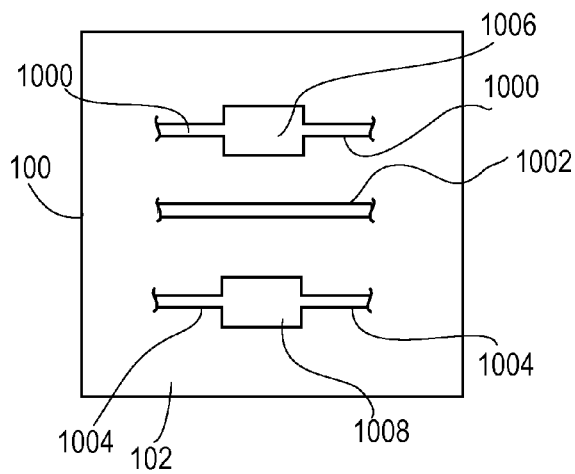
FIG. 13 is a plan view of the receiver substrate of FIG. 1 with conductive traces transferred thereto.

Referring to FIG. 13, the surface 102 of the receiver substrate 100 may have conductive traces 1000, 1002, and 1004, formed thereon by depositing a conductive material as described herein above. The conductive traces 1000, 1002, and 1004 may be portions of one or more circuits deposited on the surface 102. Only the portions 1000, 1002, and 1004 are illustrated for simplicity. However, such traces 1000, 1002, and 1004 may be coupled to other conductive traces (not shown) or electrical components (not shown) deposited on the surface 102.

The conductive trace 1000 may include a rectangular portion 1006 and the conductive trace 1004 may include a rectangular portion 1008. It should be apparent that the portions 1006 and 1008 may be any other shape.

One or more of the conductive traces 1000, 1002, and 1004 may be deposited using the metal transfer process described above, or may be deposited using another metal deposition processes including a printing process. Such processes may include flexographic printing, inkjet printing, gravure printing, lithographic printing, foil stamping, and the like.

Figure 14:
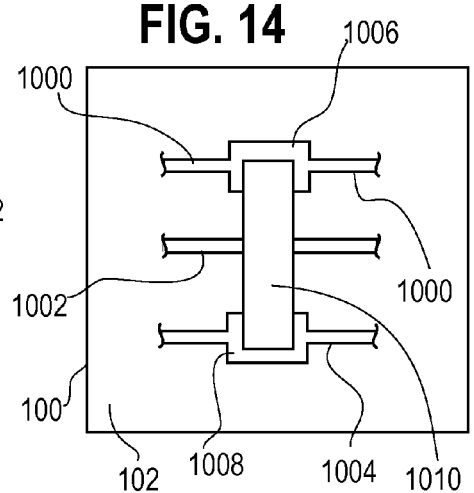
FIG. 14 is a plan view of the receiver substrate of FIG. 13 with a first pattern of adhesive deposited thereon.

Referring to FIG. 14, a first pattern of adhesive material 1010 may be deposited on the surface 102 such that the first pattern of adhesive material 1010 covers at least a portion of each conductive trace 1000, 1002, and 1004.

Figure 15:
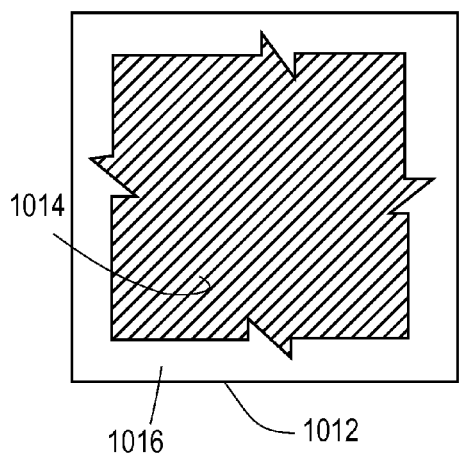
FIG. 15 is a plan view of a carrier substrate having a layer of insulating material.

Referring to FIG. 15, a carrier substrate 1012 has a layer of insulating material 1014 deposited on a surface 1016 thereof.

Figure 16:
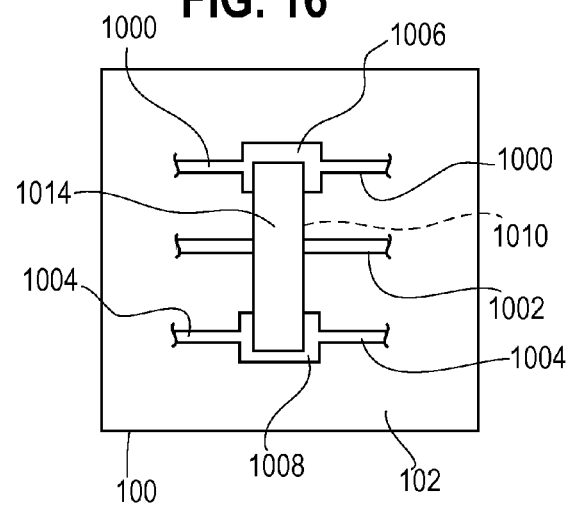
FIG. 16 is a plan view of the receiver substrate of FIG. 14 with insulating material transferred thereto.

The receiver substrate 100 with the conductive traces 1000, 1002, and 1004, and the first pattern of adhesive material 1010 is brought into contact with the carrier substrate 1012 such that the surface 102 of the receiver substrate 100 and the surface 1016 of the carrier substrate 1012 face one another. Energy and/or pressure may be applied so that a portion of the non-conductive material 1014 that contacts the first pattern of adhesive material 1010 may bond with such pattern of adhesive material 1010 and thereby may be transferred to the receiver substrate 102. If necessary, the first pattern of adhesive material 1010 may be activated by pressure and/or energy before and/or during such contact. FIG. 16 illustrates the receiver substrate 100 after the non-conductive material 1014 has been transferred thereto.

Figure 17:
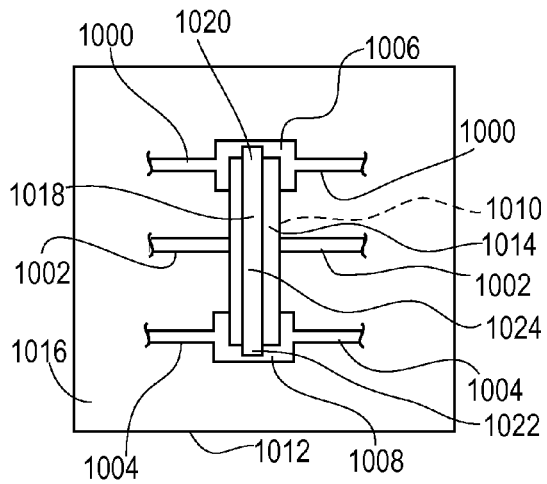
FIG. 17 is a plan view of the receiver substrate of FIG. 16 with a second pattern of adhesive material deposited thereon.

Referring to FIG. 17, a second pattern of adhesive material 1018 is deposited onto the receiver substrate 100. The second pattern of adhesive material 1018 includes portions 1020 and 1022 that contact the rectangular portions 1006 and 1008, respectively. The non-conductive material 1014 on the receiver substrate 100 separates a second portion 1024 of the second pattern of adhesive material 1018 from the conductive trace 1002.

In some embodiments, a solder material (not shown), for example, a low temperature solder may be applied on top of and/or adjacent to portions of one or both of the conductive trace 1000 and the conductive material 1028. Such solder material may facilitate bonding between, for example, such conductive trace 1000 and/or conductive material 1028 and one or more pins of a component placed thereon. In some embodiments, the solder material may be deposited using one of the printing processes noted above.

Figure 18:
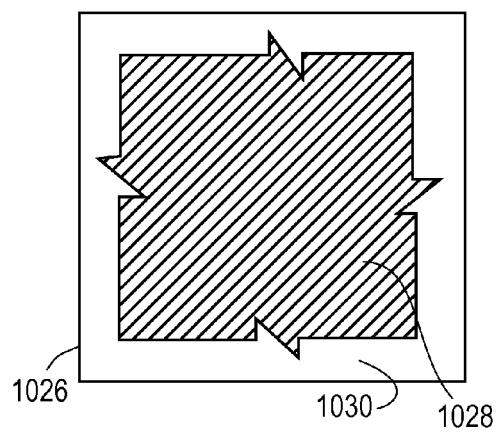
FIG. 18 is a plan view of a carrier substrate having a layer of conductive material.
Figure 19:
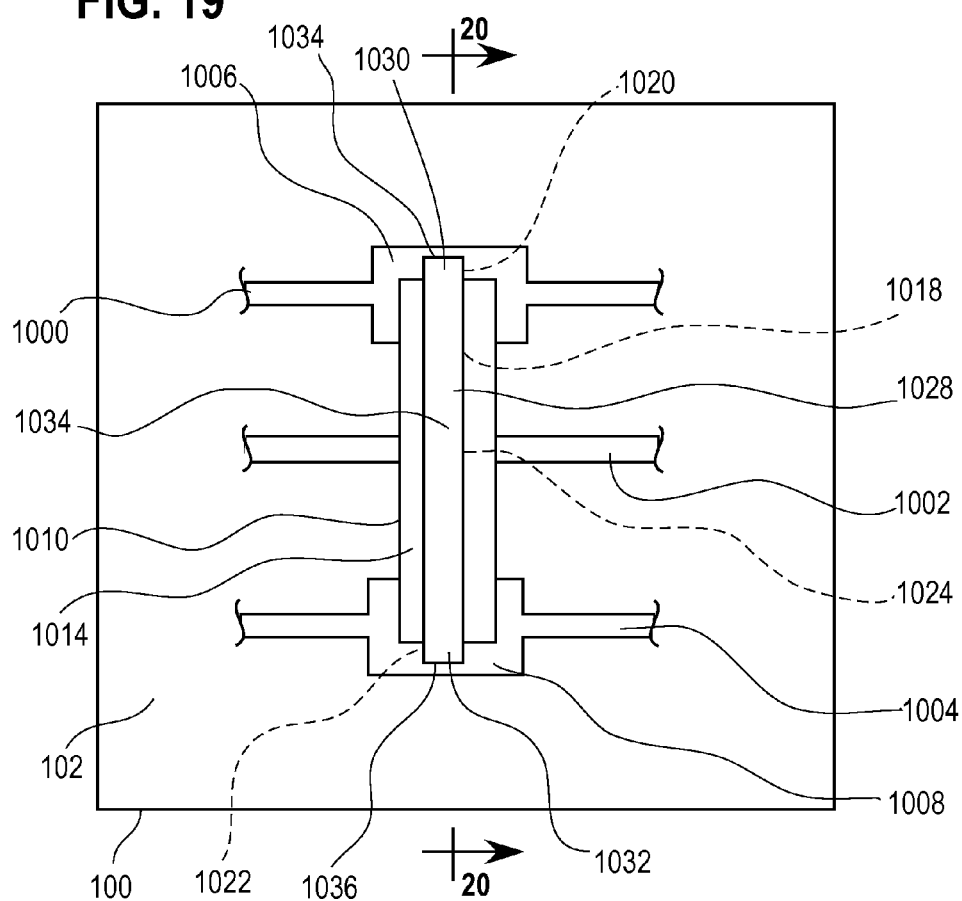
FIG. 19 is a plan view of the receiver substrate of FIG. 17 with conductive material transferred thereto.

Referring to FIG. 18, a carrier substrate 1026 has a layer of a conductive material 1028 deposited on a surface 1030 thereof. The conductive material 1028 may be brought into contact with the second pattern of adhesive material 1018, and the portion of the conductive material 1028 in contact with the second pattern of adhesive material 1018 may be transferred to the receiver substrate 100. In some embodiments, the second pattern of adhesive material 1018 may be activated using energy and/or pressure before and/or during such contact. FIG. 19 illustrates the receiver substrate 100 after the conductive material 1028 has been transferred thereto.

In one embodiment, the second pattern of adhesive material 1018 may be formed using a conductive adhesive material. In such an embodiment, the portion 1020 of the conductive adhesive material may electrically couple a portion 1030 of the conductive material 1028 with the portion 1006 of the conductive trace 1000. Similarly, the portion 1022 of the conductive adhesive material may electrically couple a portion 1032 with the portion 1008 of the conductive trace 1004. Further, a portion 1034 of the conductive material 1028 that lies on top of the conductive trace 1002 is electrically isolated from such conductive trace by the pattern of the insulating material 1014 disposed therebetween. In this manner, a conductive path may be created between the conductive traces 1000 and 1004 by the second pattern of adhesive material 1018 and the conductive material 1034 deposited thereon.

Figure 20:
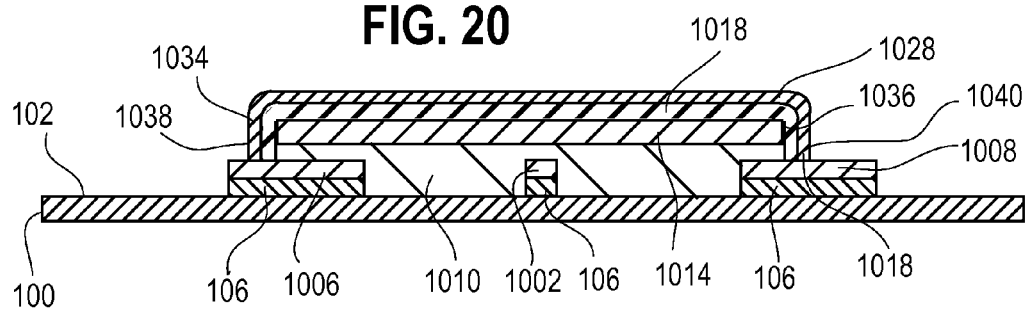
FIG. 20 is a cross-sectional view taken along the line 20-20 of the receiver substrate of FIG. 19.

In another embodiment, the second pattern of adhesive material 1018 may be formed using a non-conductive adhesive material. Referring to FIG. 20, in such embodiments, the conductive material 1028 may still create a conductive path between the traces 1000 and 1004 because conductive material 1028 may flow over edges 1034 and 1036 of the second pattern of adhesive material 1018, and contact the portions 1006 and 1008, respectively. In particular, portions 1038 and 1040 of the conductive material 1028 may thus contact with the conductive traces 1006 and 1008.

Figure 21:
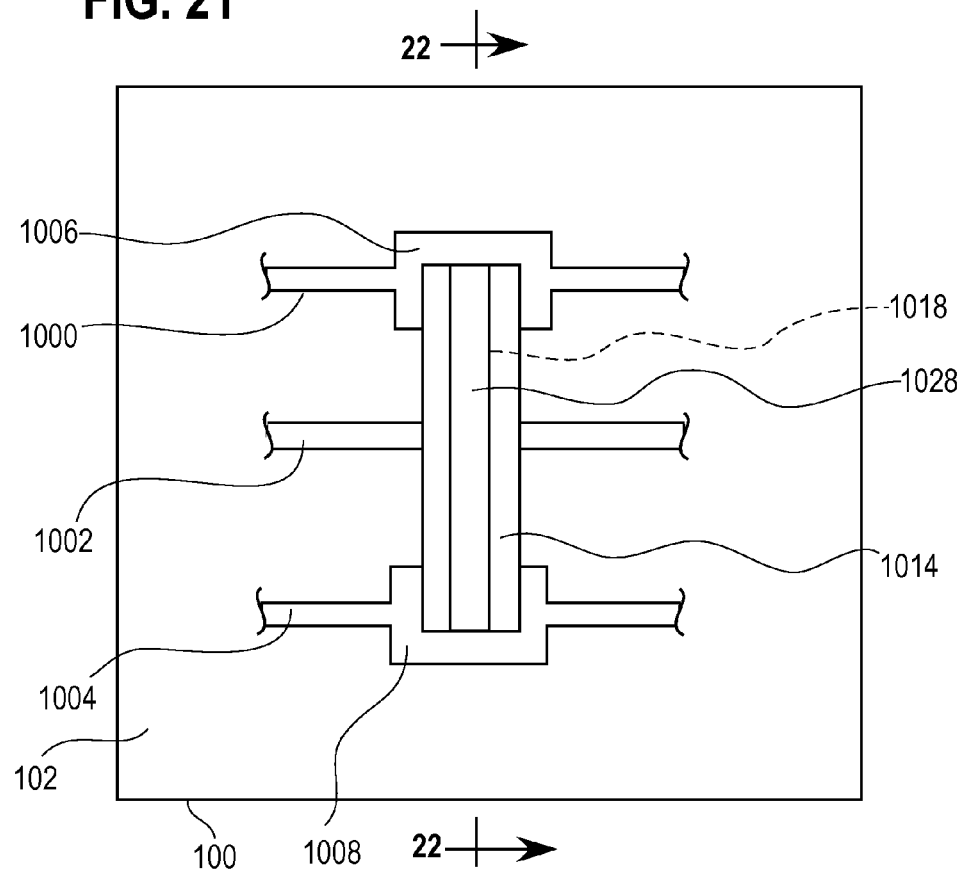
FIG. 21 is another plan view of the receiver substrate of FIG. 19.
Figure 22:
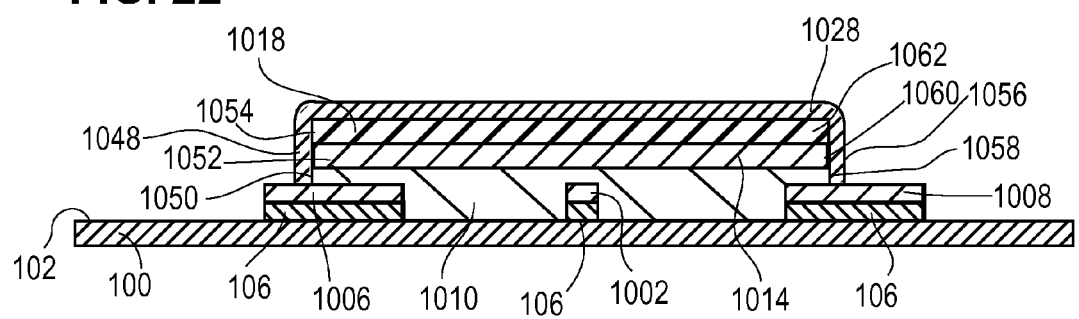
FIG. 22 is a cross-sectional view taken along the line 22-22 of the receiver substrate of FIG. 21.
Figure 27:
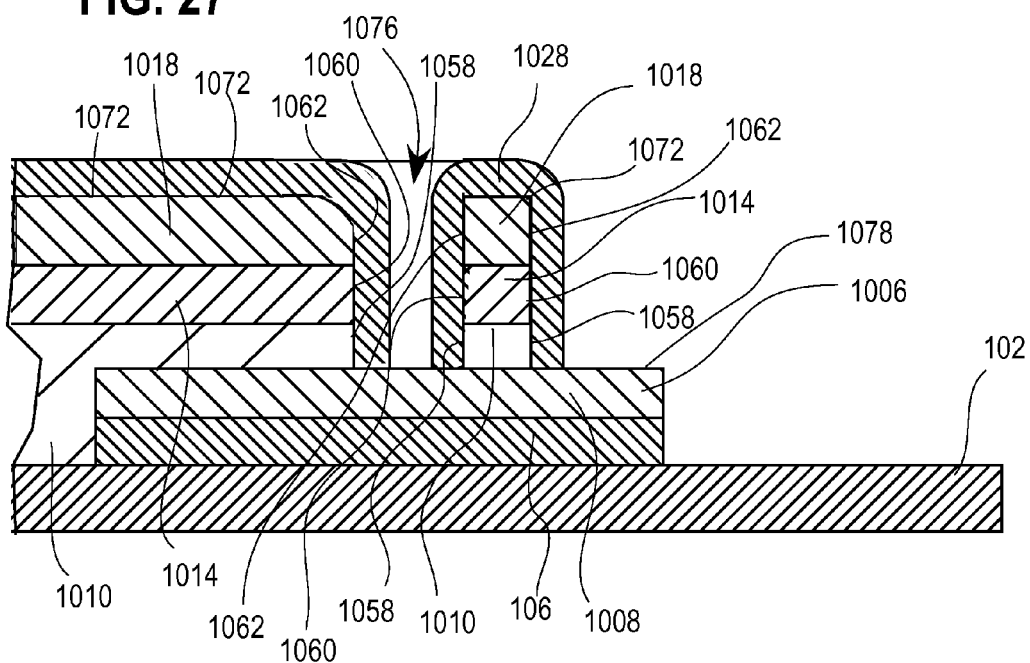
FIG. 27 is a magnified view of a portion taken from the region identified by line 27-27 of the receiver substrate of FIG. 25.

Referring to FIGS. 21 and 22, in some embodiments, the second pattern of adhesive 1018 may be printed so that no portion of such pattern extends beyond the non-conductive material 1014 to contacts the portions 1006 and 1008 of the conductive traces 1000 and 1004. In such embodiments, a portion 1048 of the conductive material 1028 deposited on the surface 102 of the receiver substrate 100 flows over edges 1050, 1052, and 1054 of the first pattern of adhesive material 1010, the portion of non-conductive material 1014 on top of such first pattern, and the second pattern of adhesive material 1018 on top of the non-conductive material 1050, respectively, and contacts the portion 1006 of the conductive trace 1000. Similarly, a portion 1056 of the conductive material 1028 flows over edges 1058, 1060, and 1062 of the first pattern of adhesive material 1010, the non-conductive material 1014, and the second pattern of adhesive material 1018, respectively, and contacts the portion 1008 of the conductive trace 1004. In this manner, the portions 1006 and 1008 are electrically coupled to one another by the conductive material 1028, while being electrically isolated from the conductive trace 1002 deposited therebetween.

Referring to FIGS. 23-27, in one embodiment, the first pattern of adhesive material 1010, the non-conductive material 1014, and the second pattern of adhesive material 1018, may be deposited onto the surface 102 to create one or more vias (or tunnels) 1070 that extend from a top surface 1072 of the second pattern of adhesive material 1018 to a top surface 1074 of the portion 1006 of the conductive trace 1000. Further, because the conductive material 1028 flows over the edges 1050, 1052, and 1054, of the first pattern of adhesive material 1010, the non-conductive material 1014, and the second pattern of adhesive material 1018, respectively, the conductive material 1028 also flows over such edges that extend into the vias 1070. The conductive material 1028 inside the vias 1070 provides additional areas of contact between the portion 1006 of the conductive trace 1000 and the conductive material 1028.

Similarly, the first pattern of adhesive material 1010, the non-conductive material 1014, and the second pattern of adhesive material 1018, may be deposited onto the surface 102 to create one or more vias 1076 that extend from the top surface 1072 of the second pattern of adhesive material 1018 to a top surface 1078 of the portion 1006 of the conductive trace 1000. As described above, the conductive material 1028 flows over the edges 1058, 1060, and 1062, of the first pattern of adhesive material 1010, the non-conductive material 1014, and the second pattern of adhesive material 1018, respectively, the conductive material 1028 also flows over such edges that extend into the vias 1076, and provide additional areas of contact between the portion 1008 of the conductive trace 1004 and the conductive material 1028.

Providing the vias 1070 and 1076 may increase the conductivity between the conductive trace 1000 and 1004.

In some embodiments, the diameter of the via 1070 may be different in the layers of material 1010, 1014, and 1018 through which such via 1070 passes. For example, a diameter of the via 1070 may be larger in the first pattern of adhesive material 1010 than in the pattern of non-conductive material 1014, and the diameter of the via 1070 in the pattern of the non-conductive material 1014 may larger than the diameter of such via 1070 in the second pattern of the adhesive material 1018. Alternately, a diameter of the via 1070 may be smaller in the first pattern of adhesive material 1010 than in the pattern of non-conductive material 1014, and the diameter of the via 1070 in the pattern of the non-conductive material 1014 may smaller than the diameter of the via 1070 in the second pattern of the adhesive material 1018. Varying the diameter of the via 1070 may create a via 1070 having a shape of a conical or pyramidal frustum, and such shape may facilitate the flow of the conductive material 1028 towards the conductive trace 1000. The diameters of the via 1070 in the different layers may be varied in accordance with materials used to supply the conductive trace 1000 and/or the conductive material 1028.

Figure 28:
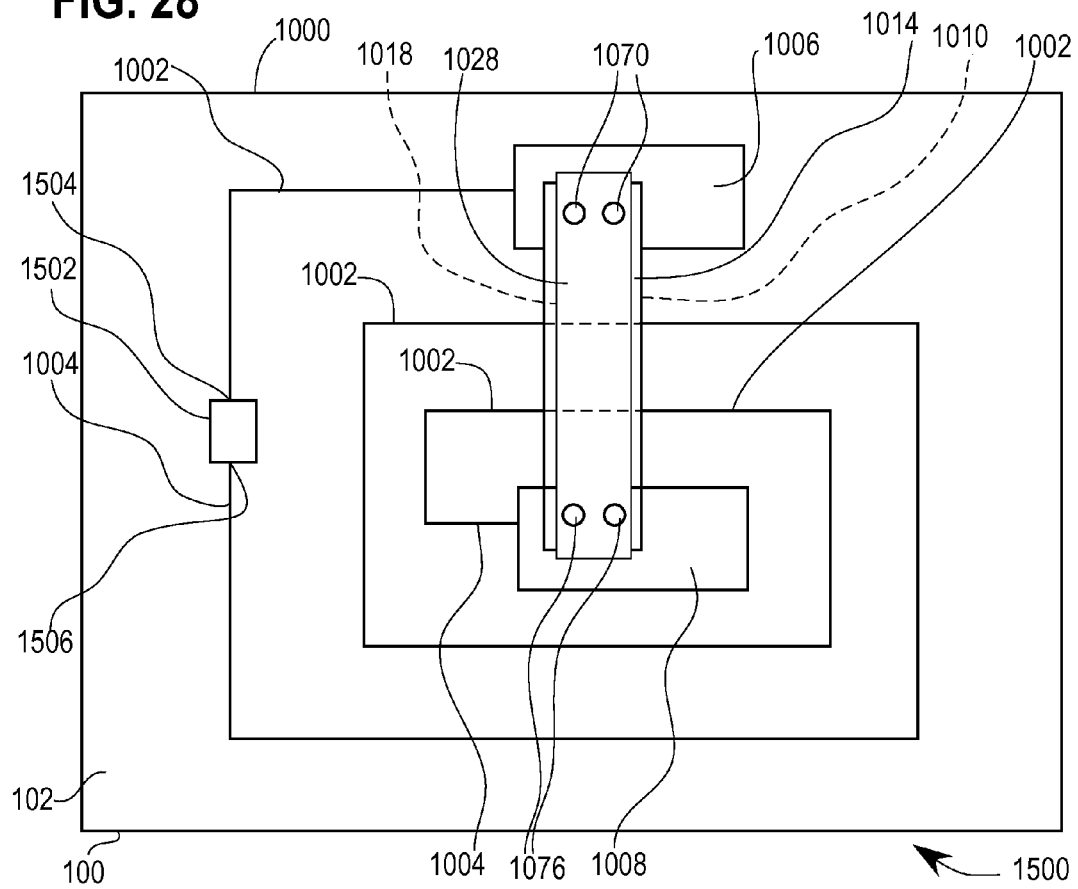
FIG. 28 is planar view of a loop antenna deposited on a receiver substrate.

Referring to FIG. 28, a loop antenna 1500 may be disposed on the surface 102 of the receiver substrate 100. Such a loop antenna 1500 may be used, for example, to provide an antenna for an RFID transceiver chip 1502. One pin 1504 of the transceiver chip 1502 may be coupled to the conductive trace 1000 of the loop antenna 1500. The conductive trace 1000 may terminate in the portion 1006. Another conductive trace 1004 of the loop antenna 1500 may be coupled to another pin 1506 of the transceiver chip 1502. The conductive trace 1004 may include one or more concentric patterns that comprise the portions 1002, and then terminate in the portion 1008. For the loop antenna 1500 to function, the terminal portions 1006 and 1008 of the conductive traces 1000 and 1004, respectively, must be conductively coupled. Further such terminal portions 1006 and 1008 may not be conductively coupled to any of the portions 1002 disposed therebetween. The first pattern of adhesive material 1010 and the non-conductive material may be deposited over portions of the terminals 1006 and 1008, and the conductive portions 1002. Thereafter, a second pattern of adhesive material 1018 and the conductive material 1028 may be deposited on top of the non-conductive portion to couple the terminal portions 1006 and 1008, as described above. The vias 1070 and 1076 may be used to improve the conductive coupling between the portions 1006 and 1008 provided by the conductive material 1028, as described above.

Referring once again to FIG. 19, it should be apparent, that one or more vias as described above may be formed in the portion 1020 of the second pattern of adhesive material 1018. Thereafter, the conductive material 1028 deposited on top of the portion 1020 of the second pattern of adhesive material 1018 may flow into such vias (not shown) and directly contact the portions 1006 of the conductive trace 1004. Similarly, such vias may be formed in the portion 1022 of the adhesive material 1018 so that the conductive material 1028 deposited thereon may flow into such vias (not shown) and directly contact the portion 1008 of the conductive trace 1004. Vias may be formed in other locations that may be apparent to those who have skill in the art in order to facilitate conductive contact between the conductive material 1028 and the conductive trace 1000.

In one embodiment, the metal foil layers 118 and 1028 applied to the receiver substrate 100, may have a thickness of approximately 2,750 Angstroms, and may be between approximately 2,500 and 3,000 Angstroms thick. In other embodiments, the metal foil layers 118 and 1028 may have a thickness of between 200 and 5,000 Angstroms. Further, the patterns of adhesive material 106, 1010, and 1018 may have a thickness of approximately 1,500 Angstroms, and may be between approximately 200 and 10,000 Angstroms thick. In addition, in some embodiments, the layer of insulating material 1014 may have a thickness of between approximately 200 and 1,500 Angstroms. In one embodiment, the thickness of the layer of insulating material 1014 may be between 300 and 400 Angstroms.

In one embodiment, the carrier substrates 112 and 1026 with the metal layers 118 and 1028, respectively, may comprise copper, or other conductive metal, deposited onto an acrylic coated polyethylene substrate. In some embodiments, the insulating material 1014 may be an acrylic material, and the carrier substrate 1012 may comprise a polyethylene substrate coated with such acrylic material 1014, or another insulating material.

In some embodiments, one or more of the adhesive materials 106, 1010, and 1018 may comprise an adhesive disclosed in co-pending U.S. patent application Ser. No. 14/825,630, titled "ADHESIVE COMPOSITION FOR INKJET PRINTING," and filed on Aug. 13, 2015. The entire contents of this application are incorporated herein by reference. For example, one or more such adhesive materials 106, 1010, and 1018 may comprise a polymer, a co-solvent, a surfactant, and water. The adhesive material 106, 1010, and/or 1018 may have a viscosity such that the adhesive material 106, 1010, and/or 1018 may be applied to the receiver substrate 102 using an adhesive applicator 118 that comprises an inkjet print head. The desired viscosity of the adhesive material 106, 1010, and/or 1018 may depend in part on the requirements of the inkjet print head used and may range from about 4.0 centipoise (4.0 milipascal-seconds) to about 14 centipoise (14 milipascal-second). In some embodiments, the inkjet print head of the adhesive applicator 118 may deposit the adhesive material 106, 1010, or 1018 on the receiver substrate 102 as the receiver substrate 102 moves relative to such inkjet print head at a speed between about 5 feet-per-minute (0.03 meters-per-second) and about 100 ft/min (0.51 meters-per-second).

In one embodiment, the adhesive material 106, 1010, and/or 1018 may include about 5% to about 30%, preferably from about 6% to about 20%, and most preferably from about 8% to about 15%, by weight of a polymer. The polymer may be a hot melt adhesive that is activated by the application of heat and pressure, such as ethylene acrylic acid co-polymer having a weight average molecular weight preferably ranging from about 15,000 to about 20,000 g/mol. The adhesive material 106, 1010, and/or 1018 may include about 2% to about 30%, preferably from about 4% to about 28%, and most preferably from about 5% to about 15%, by weight of a co-solvent, such as 1-(2-hydroxyethyl)-2-pyrrolidone (HEP). The adhesive material 106, 1010, and/or 1018 may include about 0.2% to about 3%, preferably from about 0.4% to about 2%, and most preferably about 0.5% to about 1.75%, by weight of a surfactant, such as a nonionic ethylene oxide, a polyacrylate-based surface additive, or other similar compounds. The balance of the adhesive may comprise water.

In some embodiments, the adhesive material 106, 1010, and/or 1018 may be jetted onto the receiver substrate in a pattern. A majority of the water may be vaporized once the adhesive composition is on the receiver substrate. The receiver substrate onto which the adhesive composition is jetted may be maintained at an elevated temperature from about 25° C. to about 200° C., to promote vaporization of the water. The receiver substrate may then be brought into contact with the layer of the conductive material 120, 1014, or 1028 carried by the carrier substrate 114, 1012, or 1026, respectively, as described above.

Figure 29:
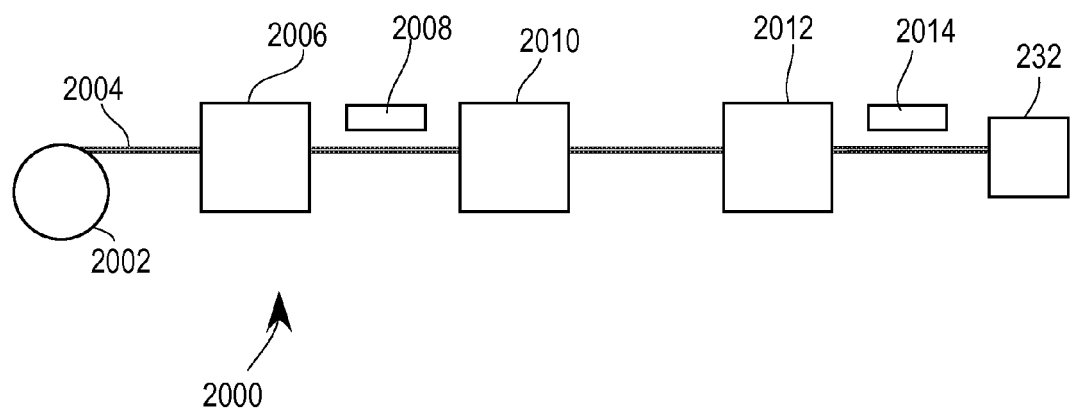
FIG. 29 is a schematic view of a manufacturing system to deposit layers of conductive traces and insulating material on a receiver substrate.

Referring to FIG. 29, in one embodiment of a manufacturing system 2000, a roll 2002 supplies a web 2004 of the receiver substrate 100. A first conductive layer deposition unit 2006 selectively deposits a conductive material to form a first circuit layer. In some embodiments, a first component deposition unit 2008 may deposit and affix electronic components onto the first circuit layer. An insulator layer deposition unit 2010 selectively deposits an insulating material on at least selected portions of the conductive material deposited by the first conductive layer deposition unit 2006. Thereafter, a second conductive layer deposition unit 2012 deposits a conductive material to form a second circuit layer, wherein at least a portion of the second circuit layer is deposited on top of the insulating material deposited by the insulator layer deposition unit 2010. In some embodiments, the conductive material deposited by the first conductive layer deposition unit 2006 is identical to the conductive material deposited by the second conductive deposition unit 2012. In other embodiments, the first conductive layer deposition unit 2006 and the second conductive layer deposition unit 2010 deposit different conductive materials.

In some embodiments, a second component deposition unit 2014 may deposit and affix electronic components onto one or both of the first circuit layer and the second circuit layer. Some embodiments of the manufacturing system 2000 may not include the first component unit 2008, and include the second component deposition unit 2014 to deposit and affix components after all of the circuit layers have been placed. In some embodiments, one or both of the first component deposition unit 2000 and the second component deposition unit 2014 may include an energy applicator to activate solder material deposited onto the receiver substrate 100 in order join pins of components with the conductive traces deposited onto the receiver substrate 100.

The first conductive layer deposition unit 2006, the insulating layer deposition unit 2010, and the second conductive layer deposition unit 2012 may be implemented by any of the material deposition units 200 or 250 described above. Further, it should be apparent that the paper or other substrate may be supplied as sheets instead of a web, and one or more the material deposition units 300 and/or 320 may be used with one another to provide the deposition units 2006, 2010, and/or 2012 of the system 2000. It will be apparent to one who has skill in the art that more may be used in a manufacturing system to form more layers on a substrate of conductive material separated by insulating material.

The transfer of a metal foil to form conductive traces of a circuit may be formed on a variety of substrates including paper, card stock, plastics, and the like. Because of the continuity of the metal foil and because the foil transfer is undertaken under pressure in a nip, the resulting circuit may be flatter and smoother than possible with other circuit printing processes.

INDUSTRIAL APPLICABILITY

In summary, a portion of a metal foil layer 118 is transferred from a carrier substrate 112 to a receiver substrate 100. An adhesive material 106 is applied in a pattern on the receiver substrate, the portion of the metal foil layer 118 is affixed to the adhesive material 106 as the receiver substrate 100 and carrier substrate 112 are transported through a nip. In some cases, pressure alone is sufficient to transfer the portion of the metal foil layer 118 to the receiver substrate 100. In other cases, a source of energy, for example heat or ultraviolet light, is sufficient to transfer the portion of the metal foil layer 118 to the receiver substrate 100. In still other, both pressure and the energy source are using in combination to facilitate such transfer.

Further, although the embodiments disclosed herein are described in connection with the transfer of a metal foil, it should be apparent that such embodiments may be adapted to transfer other materials from a first substrate to a second substrate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the embodiments are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure. No language in the specification should be construed as indicating any element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

What is claimed is:

1. A method of producing an electronic device, comprising the steps of:
    applying an adhesive material in a first pattern on a surface of a first substrate;
    bringing a second substrate having a metal foil disposed thereon proximate to the first substrate such that a portion of the metal foil contacts the adhesive material;
    activating the adhesive material;
    separating the first substrate and the second substrate, whereby the portion of the metal foil is transferred to the first substrate;
    applying a further adhesive material in a second pattern on top of the transferred metal foil;
    forming a via from a top surface of the further adhesive material to the transferred metal foil; and
    depositing a metallic material on top of the second pattern;
    wherein the metallic material is conductively coupled to a portion of the transferred metal foil.

2. The method of claim 1, wherein the step of applying the further adhesive material includes the step of applying the further adhesive material such that no portion of the second pattern of the further adhesive material extends beyond the first pattern of adhesive material.

3. The method of claim 1, wherein the transferred metal foil and the metallic material are conductively coupled through the via.

4. The method of claim 1, further including the step of applying a non-conductive material between the further adhesive material and the transferred metal foil.

5. The method of claim 4, wherein the non-conductive material has a thickness between 200 Angstroms and 10,000 Angstroms.

6. The method of claim 4, further including the steps of forming a first via from a top surface of the further adhesive material to a top surface of the non-conductive material, and forming a second via from a top surface of the non-conductive material to a top surface of the transferred metal foil, wherein first via and the second via combine to couple the top surface of the further adhesive material with the top surface of the metal foil.

7. The method of claim 6, wherein a diameter of the first via is substantially different than a diameter of the second via.

8. The method of claim 1, wherein the first pattern of the adhesive material has a thickness between 200 and 10,000 Angstroms.

9. The method of claim 1, wherein activating the adhesive includes activating the adhesive while the portion of the metal foil is in contact with the adhesive material.

10. The method of claim 1, wherein activating the adhesive includes applying energy to activate the adhesive.

11. The method of claim 10, wherein the energy includes at least one of mechanical pressure and heat.

12. A method of producing an electronic device, comprising the steps of:
    jetting an adhesive material in a first pattern on a surface of a first substrate;
    bringing a second substrate having a metal foil disposed thereon proximate to the first substrate such that a portion of the metal foil contacts the adhesive material;
    activating the adhesive material;
    separating the first substrate and the second substrate, whereby the portion of the metal foil is transferred to the first substrate;
    applying a further adhesive material in a second pattern on top of the transferred metal foil;
    depositing a metallic material on top of the second pattern; and
    forming a via from a top surface of the further adhesive material to the transferred metal foil;
    wherein the metallic material is conductively coupled to a portion of the transferred metal foil.

* * * * *